United States Patent [19]

Sueri et al.

[11] Patent Number: 5,424,665
[45] Date of Patent: Jun. 13, 1995

[54] POWER TRANSISTOR DRIVING CIRCUIT

[75] Inventors: Stefano Sueri; Sergio Palara, both of Catania, Italy

[73] Assignee: Consorzio Per La Ricerca Sulla Microelettronica Nel Mezzogiorno, Catania, Italy

[21] Appl. No.: 886,680

[22] Filed: May 21, 1992

[30] Foreign Application Priority Data

May 21, 1991 [IT] Italy .................. MI91A1390

[51] Int. Cl.[6] .............. H03B 1/00; H03K 17/14; H03K 17/60; G05F 1/40
[52] U.S. Cl. ................... 327/108; 327/110; 327/378; 327/483; 327/484; 327/490; 323/289; 323/312; 323/315
[58] Field of Search ............ 307/270, 253, 296.6, 307/310, 315, 254; 323/289, 312, 315; 327/108, 110, 482, 484, 490, 378, 483

[56] References Cited
U.S. PATENT DOCUMENTS 4,910,480 3/1990 Crosby .................... 330/288
4,961,006 10/1990 Pace et al. ................ 307/270
4,990,864 2/1991 Kwan ..................... 330/288
5,027,004 6/1991 Palara .................... 307/270
5,028,811 7/1991 Le Roux et al. ........... 307/270
5,138,515 8/1992 Bourgeois ................. 307/270
5,172,018 12/1992 Colandrea et al. ......... 307/296.6

Primary Examiner—Timothy P. Callahan
Assistant Examiner—Trong Phan
Attorney, Agent, or Firm—Felsman, Bradley, Gunter & Dillon

[57] ABSTRACT

A driving circuit is provided for a power transistor connected to an inductive load. A detection resistor is placed between ground and the emitter of the power transistor. The driving circuit has a first portion which is capable of generating a first current which is a non-linear function of the voltage across the detection resistance. A second portion of the driving circuit is used to generate a base current for the power transistor that is proportional to the first current. The non-linear function of the first current compensates for the non-linear gain with respect to collector current of the power transistor.

11 Claims, 3 Drawing Sheets

POWER TRANSISTOR DRIVING CIRCUIT

BACKGROUND OF THE INVENTION

1. Technical Field

The present invention relates to a driving circuit for a power transistor wherein a base current has a given function of that of the collector.

2. Description of the Related Art

A common power transistor circuit has a power NPN transistor, or Darlington pair, with an inductor as a load on the collector of the power transistor. A driving circuit supplies an input to the base of the power transistor so that, for a voltage value of zero at the input of the driving circuit, the collector current of the power transistor is zero. When the voltage across the input of the driving circuit goes high, the current on the collector of the power transistor begins to rise in a linear fashion.

Normally, the current necessary to drive the base input of the power transistor is equal to the maximum value of base current beginning immediately when the voltage across the input of the driving device goes high. This maximum value of base current is that value which is suitable for driving the power transistor to its maximum collector current value. Such a driving technique, however, requires unnecessary base current and dissipates extra power. This occurs because it is not necessary to have a maximum value of the base current as soon as the voltage across the input of the driving circuit goes high.

As described in U.S. Pat. No. 5,027,004 issued Jan. 25, 1991, an alternative method is provided to that just described. This alternative method provides for driving the power transistor by using a base current for the power transistor proportional to its collector current. In this technique, a minimum value for the gain of the power transistor is assumed. With the exclusion of the initial switching, the base current of the power transistor is forced to be equal to the ratio between its present collector current and the minimum, presumed constant, gain.

This latter type of drive provides advantages with respect to that previously described, but it is not optimized because the gain of the power transistor is not actually constant as the collector current varies. In addition, the gain of the power transistor changes as the junction temperature varies. In addition, the circuit that is used to accomplish the improved technique is fairly complex. This drive circuit must (1) detect the base current of the power transistor, (2) detect the emitter current of the power transistor, and (3) provide a current amplifier to compare the detected base and emitter current values. The current amplifier generates an output for a control circuit of the power transistor.

The control circuit thus operates on the base current of the power transistor, so as to make it proportional to the collector current. Since this is a feedback circuit, the driving circuit has the disadvantage that it must be frequency compensated, which can give rise to instability.

SUMMARY OF THE INVENTION

It is therefore an object of the present invention to provide a driving circuit for a power transistor in which the base current is a function of the collector current. Regulation of the base current takes into account the changes and gain of the power transistor as the collector current and junction temperature vary.

Another object of the present invention is the provision of such a driving circuit which is simple in construction and does not require frequency compensation in order to avoid instability.

Therefore, in accordance with the present invention, a driving circuit is provided for a power transistor connected to an inductive load. A detection resistor is placed between ground and the emitter of the power transistor. The driving circuit has a first portion which is capable of generating a first current which is a function of the voltage across the detection resistance. A second portion of the driving circuit is used to generate a base current for the power transistor that is proportional to the first current.

BRIEF DESCRIPTION OF THE DRAWINGS

The features of the present invention shall be made more evident by the embodiments illustrated as a non-limiting example in the enclosed drawings, wherein.

DETAILED DESCRIPTION OF PREFERRED EMBODIMENTS

In summary, the advantages of the present invention are obtained using a driving circuit for a power transistor. Such circuit includes a detection resistance interposed between the emitter of the power resistor and ground. It also includes a first circuit part suitable for generating a first current which is a function of the voltage across the detection resistance. A second portion is suitable for generating a driving base current for the power transistor that is proportional to the first current. By means of this arrangement, it is possible to supply the power transistor with a base current that is proportional to a current which is a function of the voltage across the detection resistance. The base current is thus dependent upon the collector current and on the gain of the power transistor.

In this manner, through the driving circuit of the present invention, a base current is determined that varies as a function of the collector current itself. The base current also takes into account the gain of the power transistor both as a function of the collector current and of the junction temperature. The use of such a driving circuit allows a control circuit to be made which is simple to manufacture. Such a circuit is also stable since, there being no feedback, no frequency compensation is required.

Figure 1:
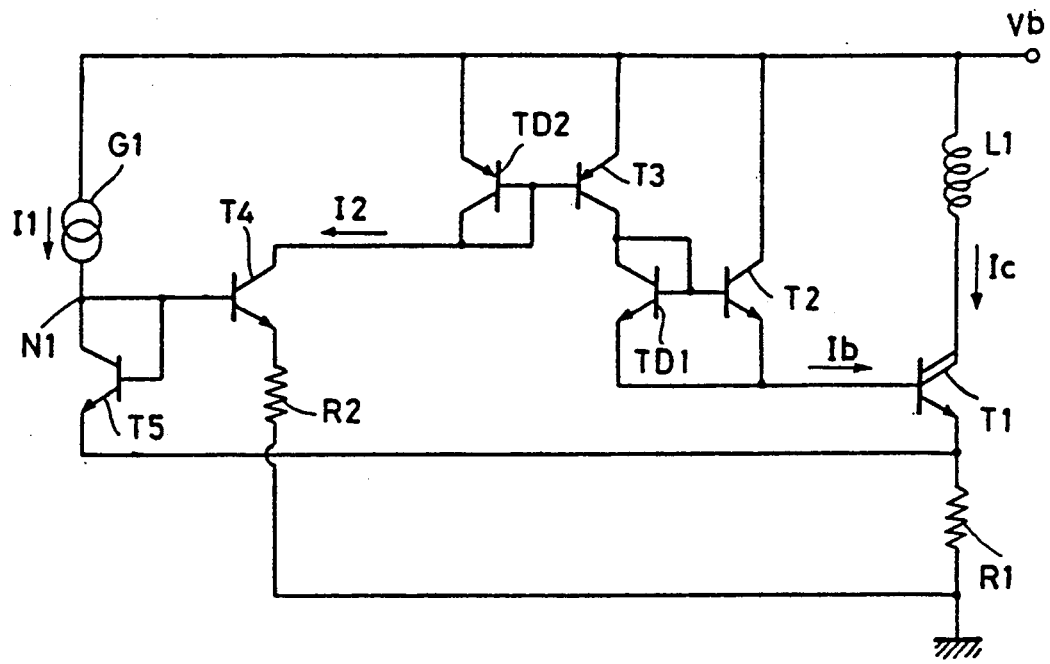
FIG. 1 illustrates a first embodiment of a driving circuit according to the present invention.

Referring to the example of FIG. 1, an NPN type transistor T1 is shown in the example as a Darlington configuration. Transistor T1 is connected to supply voltage Vb through an inductive load L1 across its collector. The emitter of power transistor T1 is connected to ground through a detection resistor R1. The base of power transistor T1 is connected to the emitter of NPN transistor T2, which is arranged in a current-mirror configuration with a diode transistor TD1.

The collector of transistor T2 is connected to the power supply Vb while the base is connected to the collector of PNP transistor T3. The collector and base of diode transistor TD1 are also connected to transistor T3 in a current-mirror configuration with transistor T2. The emitter of transistor T3 is connected to the power supply Vb into the emitter of diode transistor TD2. The base of transistor T3 is connected to the collector and base of transistor TD2, and to the collector of NPN transistor T4.

The emitter of transistor T4 is connected to ground through resistor R2. The base of transistor T4 is connected to the base of an NPN transistor T5 and to a circuit node N1 connected to the collector of transistor T5. The emitter of transistor T5 is connected to the emitter of transistor T1. A current generator G1 is connected to the circuit node N1, with the other end connected to the supply voltage Vb.

The current-mirror configuration of the transistor T3 with a diode transistor TD2, and of the transistor T2 with the diode transistor TD1, is used to provide a base current $$Ib = I2 \, (A3/AD2 * A2/AD1) \qquad (1)$$

where A3, AD2, A2, AD1, are the emitter areas of T3, TD2, T2, and TD1, respectively.

If $(A3/AD2*A2/AD1)=N$, where N is the multiplication factor of the above-described current-mirror, then $Ib=NI2$, where I2 is the collector current of the transistor T4.

The factor N, as well as the power transistor, or Darlington, T1 are fabricated in accordance with known principles. Components that are also formed according to the prior art, but which are characteristic of the circuit according to the present invention, include: the current generator G1; the transistor T5; the transistor T4 with its emitter resistance R2; and the detection resistor R1.

In summary, if the curve of the collector current Ic of the power transistor T1 is known, an important aspect of the present invention consists of determining a current I2 that varies as a function of Ic. This current should take into account the curve of the gain of the power transistor T1 in relation both to the collector current Ic and to the junction temperature.

Figure 3:
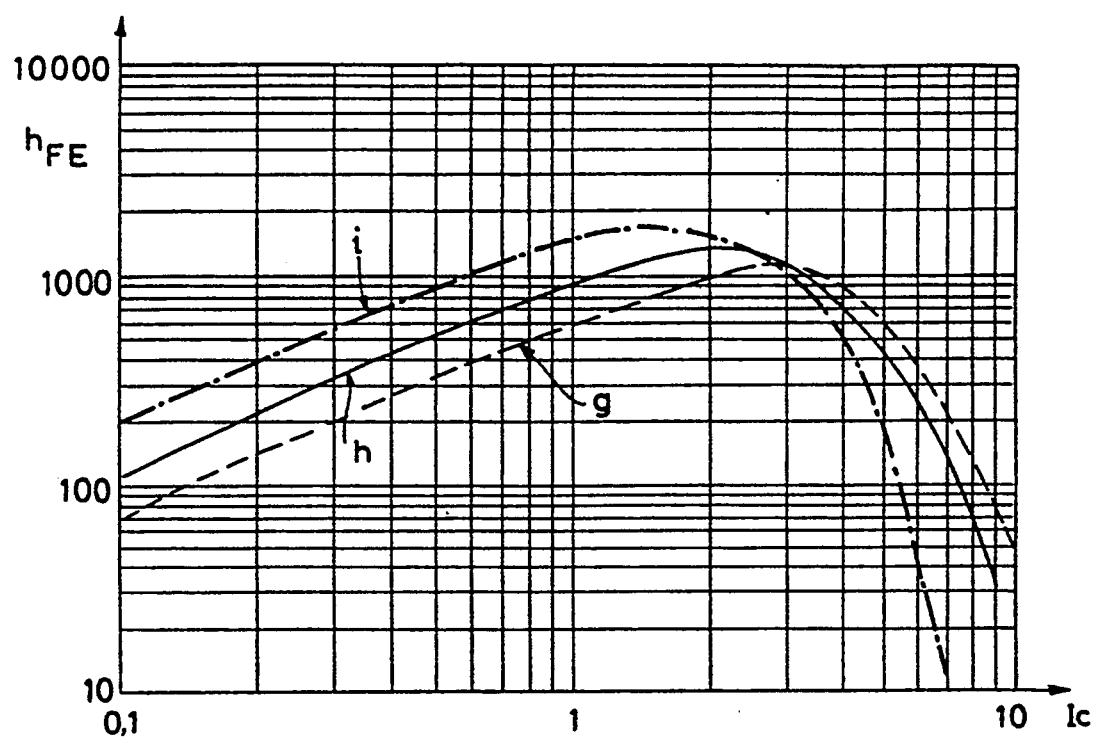
FIGS. 3 and 4 are curves of the theoretical gain of the power transistor at different temperatures and as a function of the collector current, and actual curves using the circuit of the present invention.

The variation of the gain $h_{FE}$ of the power transistor T1 as a function of the collector current Ic and to the junction temperature is illustrated by the curves of FIG. 3. Curve g illustrates the variation at $-40°$ C., curve h at 25° C., and curve i at 150° C. Since $Ib=NI2$, the base current of the power transistor T1 follows the same curve as I2.

Applying Kirchhoff's Law to the mesh consisting of the resistances R1, R2 and of the transistors T4, T5, it follows that:

$$V_{BE}(T5) + R1*Ic = V_{BE}(T4) + R2*I2 \qquad (2)$$

$$V_{BE} = KT/q * ln(Ic/A_E J_S) \qquad (3)$$

where:
K = Boltzmann's constant
T = temperature of the junction in degrees Kelvin
$A_E$ = area of the emitter
$J_S$ = density of the inverted saturation current of a bipolar transistor Also, the collector current of the transistor T5 is equal to the current I1 generated by the generator G1. With simple substitutions the following is obtained:

$$Ic = (R2*I2/R1) + (kT/qR1)lnI2/I1 \qquad (4)$$

The expression of equation (4) gives the relationship between Ic and I2. In particular, for each value of Ic there is obtained a corresponding value of I2 which takes into account the trend of the gain $h_{FE}$ of the power transistor T1. As far as its operation is concerned from a qualitative point of view, consider the instant at which Ic=0 and assume that Ic has the linearly rising curve illustrated in FIG. 6. This curve follows the curve of the charge curve of an inductor. Assuming for simplicity that R2=0, the following equation holds $$I2 = I1 * e^{(R1Icq/kT)} \qquad (5)$$

This means that I2 has an exponential trend with a steeper or flatter slope according to the value of R1. Thus, when Ic=0, I2=I1. Taking into account the fact that Ib=NI2, the base current of the power transistor is given by Ib=NI1. This value of current is necessary to activate the power transistor T1 at the initial instant. If the power transistor is a Darlington, resistances between its base and emitter conduct some current to ground.

When the collector current Ic begins to rise, a voltage appears across resistor R1 which also rises linearly. As a consequence, the voltage potential of the point N1 of FIG. 1 also rises. Since it has been assumed that R2=0, this voltage increase is reflected entirely as an increase in the base-emitter voltage of the transistor T4, with the corresponding increase of the current I2 according to equations (4).

In the case wherein resistor R2 has a value greater than zero, part of the voltage R1*Ic is dropped across the resistor R2, and the gradient of the curve of I2 falls as R2 increases.

In the preferred embodiment, the circuit of FIG. 1 lends itself well to being integrated monolithically by using: (a) for the detection resistance R1 an aluminum metal conductor, whose resistivity varies as a function of the temperature at +4500 ppm/°C.; and (b) for the resistor R2 a diffused resistance as known in the art, whose resistivity varies as a function of the temperature at +2500 ppm/°C. When a circuit is formed in this manner, equation (4) gives a curve of I2, and thus of Ib=NI2, that follows the variations in gain of the power transistor as a function of temperature. This is especially true for high values of the collector current, for which use the circuit is primarily intended.

Figure 4:
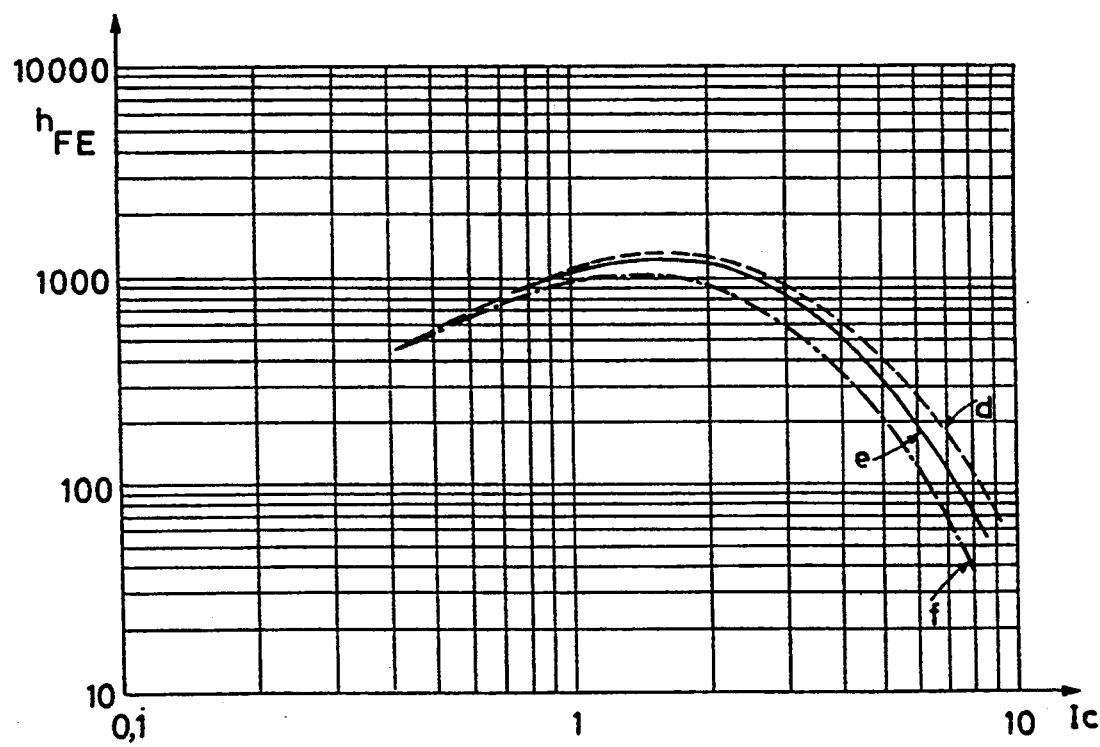
Figure 5:
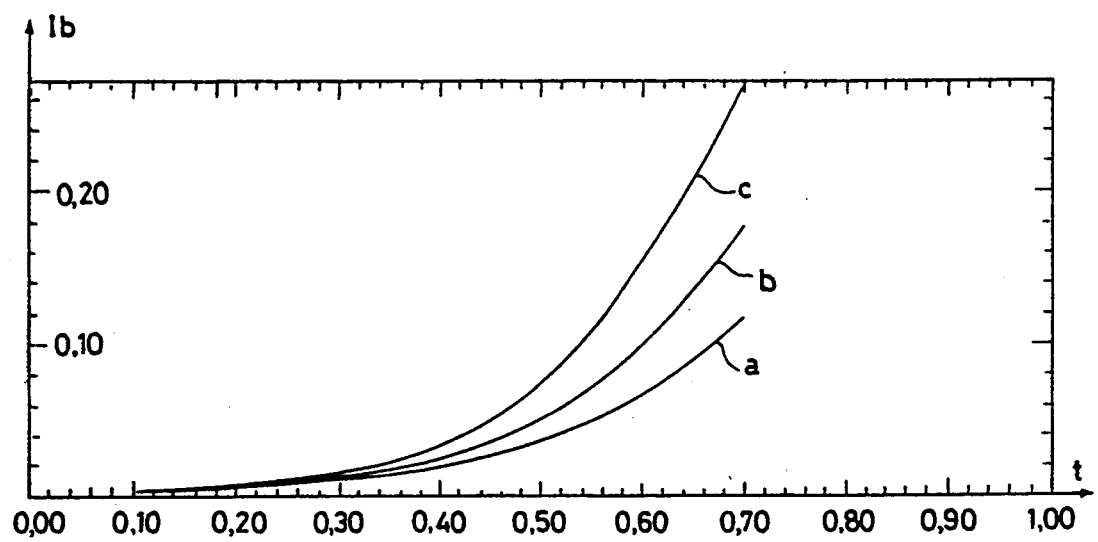
FIGS. 5 and 6 illustrate curves of the base current and the collector current, respectively, versus time of the power transistor at different temperatures, obtained in accordance with the present invention.
Figure 6:
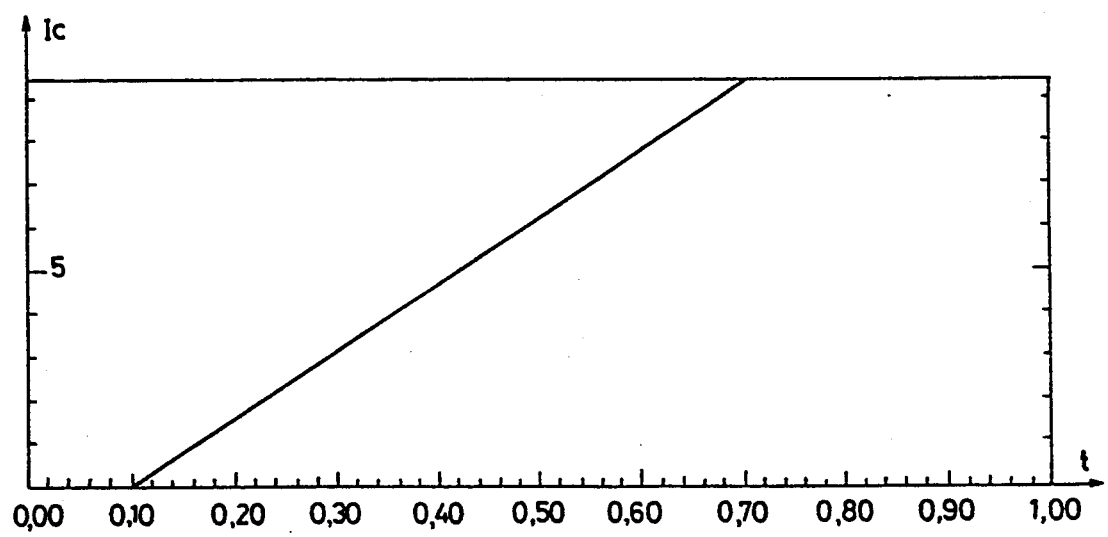

When the circuit of FIG. 1 is simulated on a computer, at the temperatures of $-40°$ C., plus 25° C., and plus 150° C., the curves a, b, and c respectively of FIG. 5 are obtained for the current Ib. These curves illustrate the trend of Ib at these three temperatures as a function of Ic, whose curve is illustrated in FIG. 6 and is assumed to be linearly increasing in time. The curve of FIG. 6 represents the charging current of the inductor L1. The resulting curves of the gain of the power transistor T1 as a function of Ic and of the junction temperature are shown in FIG. 4, which takes the simulation of FIGS. 5 and 6 into account.

Comparing the real curve of the gain of a power transistor T1 as a function of the collector current and of the junction temperature shown in FIG. 3, with that obtained with the simulations, shown in FIG. 4, it is seen that there is a satisfactory agreement primarily at high operating currents of the power transistor T1. Since transistor T1 is primarily operated in this region, this attains an important object of the present invention.

In the case where the power device has a high gain, equation (4) indicates that it is necessary that I1 have a very low value, on the order of tens of microamperes. But in this case, still referring to FIG. 1, the contribution of the base current of T4 that is taken away from I1 can become substantial. In this event, the current I2 no longer flows through the diode-connected transistor T5. Instead, the current I1-Ib(T4) flows through T4, where Ib(T4) is the base current of the transistor T4.

When the current I1 becomes on the order of ten of microamperes, almost all of I1 becomes the base current of T4. Almost no current flows through T5, thus appreciably altering the base-emitter voltage of T5. As a consequence, the correct operation of the entire circuit is affected.

Figure 2:
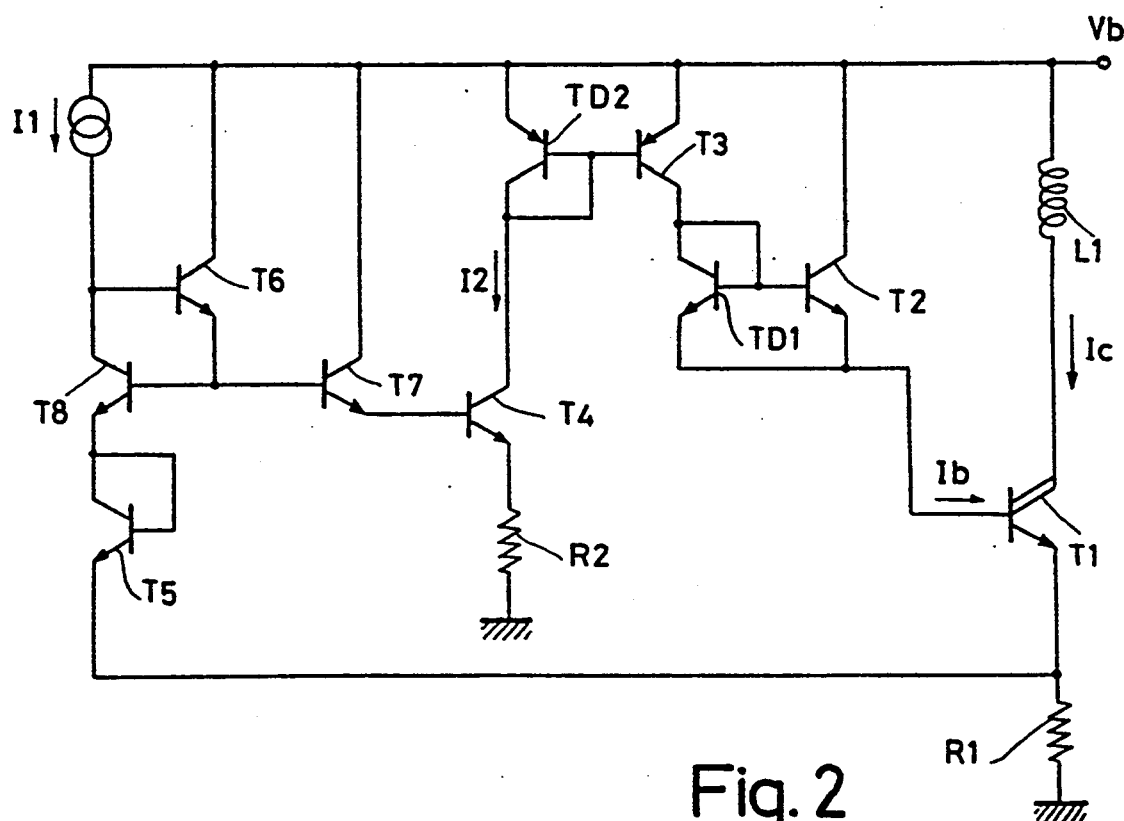
FIG. 2 illustrates a second embodiment of a driving circuit according to the present invention.

FIG. 2 illustrates a preferred embodiment for the case wherein I1 is low. The circuit of FIG. 2 differs from that of FIG. 1 in the presence of transistors T6, T7, and T5. These transistors cause the circuit to operate as desired in accordance with the principles of the present invention with very low values of the current I1.

Transistor T6 has its base connected to the current generator I1. The collector of T6 is connected to the power supply Vb, and the emitter is connected to the base of transistor T7. Transistor T7 has its collector connected to the power supply Vb, and its emitter connected to the base of transistor T4. The base of transistor T8 is also connected to the base of transistor T7. The collector of transistor T8 is connected to the base of transistor T6, and the emitter of transistor T8 is connected to the collector of transistor T5.

The operation of the circuit of FIG. 2 is very similar to that of the circuit of FIG. 1, with the advantage that almost all of the current I1 flows through transistors T8 and T5 while keeping the base-emitter voltages unchanged as I2 changes.

Applying Kirchoff's equation to the mesh consisting of R1, T5, T8, T7, T4, R2 we have:

$$Ic = (R2/R1)*I2 + kT/qR1 * \ln(I2^2/h_{FE}I1^2) \quad (6)$$

Since $$I2 = (AD1*AD2*/A2*A3)Ib \quad (7)$$

substituting (7) and (6), we have an expression of Ic as a function of Ib of the type obtained for the circuit of FIG. 1.

The curves of the base current Ib, of the collector current Ic, and of the parameter $h_{FE}$ given in FIGS. 3–6 apply equally well to the circuit of FIG. 2.

While the invention has been particularly shown and described with reference to a preferred embodiment, it will be understood by those skilled in the art that various changes in form and detail may be made therein without departing from the spirit and scope of the invention.

What is claimed is:

1. A driving circuit for a bipolar power transistor with a base current being a given function of that of the collector, comprising a detection resistor interposed between the emitter of the power transistor and ground so that all current flowing through the transistor flows through the detection resistor, a first circuit part suitable for generating a first current being a non-linear function of the voltage across said detection resistor, and a second circuit part suitable for generating a driving base current of the power transistor that is proportional to said first current, wherein said second circuit part includes two pairs of transistors, each pair consisting of a transistor and of a diode-connected transistor arranged in a current-mirror configuration, wherein the driving base current has a given non-linear dependance on the collector current of the power transistor which compensates for the gain variation of the power device with varying collector current.

2. The driving circuit according to claim 1, wherein said first circuit part comprises a transistor with the base operationally connected to the emitter of the power transistor and to a constant current generator.

3. The driving circuit according to claim 2, wherein said first circuit part further comprises transistors associated with said transistor to amplify the value of the base current of said transistor in the case where the power transistor is of the high-gain type.

4. The driving circuit according to claim 2, wherein said transistor is connected to ground through a resistor having a value chosen in a manner such as to vary the base current of the power transistor as a function of the gain of the power transistor.

5. The driving circuit according to claim 4, wherein said resistor is of the diffused type, and said detection resistor is formed by an aluminum conductor so that the ratio between the collector current and the base current of the power transistor with the variation of temperature corresponds to the actual variation in temperature of the gain of said power transistor.

6. A circuit for controlling a bipolar power transistor, comprising:
    means for detecting a current through the power transistor;
    means for generating a first current which is a non-linear function of the current through the power transistor; and
    means for generating a second current proportional to the first current, and for driving the power transistor with the second current, said means for generating a second current including at least one current mirror for generating the second current to be proportional to the first current.

7. The circuit of claim 6, wherein said means for detecting comprises a resistor in series with the emitter of power transistor, wherein all current flowing through the transistor flows through the resistor, and wherein said means for generating the first current comprises a circuit for generating a current which is a non-linear function of the voltage across said resistor.

8. The circuit of claim 7, wherein said circuit for generating a current comprises:
    a constant current source; and
    a transistor having a base operationally connected to an emitter of the power transistor and to said constant current source.

9. The circuit of claim 8, further comprising:
    a current amplifier connected between said constant current source and the base of said transistor.

10. The circuit of claim 6, wherein said at least one current mirror comprises two current mirrors connected so that an output of a first drives an input of a second.

11. The circuit of claim 10, wherein each of said current mirrors comprises a transistor connected to a diode-connected transistor.

* * * * *